(12) United States Patent
Hata et al.

(10) Patent No.: US 7,215,546 B2
(45) Date of Patent: May 8, 2007

(54) PUMP, ELECTRONIC APPARATUS, AND COOLING SYSTEM

(75) Inventors: Yukihiko Hata, Hamura (JP); Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 11/103,374

(22) Filed: Apr. 11, 2005

(65) Prior Publication Data

US 2005/0241312 A1    Nov. 3, 2005

(30) Foreign Application Priority Data

Apr. 28, 2004    (JP) .............................. 2004-134427

(51) Int. Cl.
H05K 7/20 (2006.01)
F04B 35/04 (2006.01)

(52) U.S. Cl. ...................... 361/699; 417/353; 361/698; 257/714; 165/80.4; 165/121; 165/104.33

(58) Field of Classification Search ................ 361/687, 361/689, 698–699, 700–711; 174/15.1; 257/714–716; 165/80.3, 80.4, 104.33, 104.21; 417/55.1, 420, 423.8, 423.14; 62/252.1, 62/252.2
See application file for complete search history.

(56) References Cited

U.S. PATENT DOCUMENTS

| 5,089,936 A | 2/1992 | Kojima et al. |
| 5,268,817 A | 12/1993 | Miyagawa et al. |
| 5,594,619 A | 1/1997 | Niyagawa et al. |
| 5,648,889 A | 7/1997 | Bosli |
| 5,731,952 A | 3/1998 | Ohgami et al. |
| 5,901,035 A | 5/1999 | Foster et al. |
| 6,005,767 A | 12/1999 | Ku et al. |
| 6,026,888 A | 2/2000 | Moore |
| 6,049,459 A | 4/2000 | Edmonds et al. |
| 6,141,214 A | 10/2000 | Ahn |

(Continued)

FOREIGN PATENT DOCUMENTS

EP    0834795    4/1998

(Continued)

*Primary Examiner*—Michael Datskovskiy
(74) *Attorney, Agent, or Firm*—Blakely Sokoloff Taylor & Zafman, LLP

(57) ABSTRACT

The present invention provides a cooling pump, an electronic apparatus, and a cooling system in which positioning between a heat generating unit and a cooling pump can be achieved easily. The cooling pump according to the invention includes: a rotor having a disk-shaped member fixed to a revolving shaft, impellers for pressurizing liquid coolant provided on the disk-shaped member, a plurality of permanent magnets disposed into a ring shape disposed on and fixed to the disk-shaped member; a case including a pump chamber for rotatably accommodating rotor, an inlet port and a discharge port for the liquid coolant, and a heat receiving portion for the a heat generating unit which corresponds to part of the side wall of the pump chamber; a cover that closes the case in a liquid-tight manner and is formed with a recess, a stator stored in the recess of the cover for generating revolving magnetic field by a plurality of electromagnets and providing torque about the revolving shaft to the rotor; and a positioning member joined to the heat receiving portion for positioning with respect to the a heat generating unit.

4 Claims, 9 Drawing Sheets

U.S. PATENT DOCUMENTS

| | | | |
|---|---|---|---|
| 6,148,906 A | 11/2000 | Li et al. | |
| 6,166,907 A | 12/2000 | Chien | |
| 6,196,850 B1 | 3/2001 | Dietz et al. | |
| 6,231,371 B1 | 5/2001 | Helot | |
| 6,282,082 B1 | 8/2001 | Armitage et al. | |
| 6,296,048 B1 | 10/2001 | Sauer | |
| 6,313,990 B1 | 11/2001 | Cheon | |
| 6,327,145 B1 * | 12/2001 | Lian et al. | 361/697 |
| 6,333,847 B1 | 12/2001 | Katsui et al. | |
| 6,377,452 B1 | 4/2002 | Sasaki et al. | |
| 6,396,687 B1 | 5/2002 | Sun et al. | |
| 6,408,937 B1 * | 6/2002 | Roy | 165/104.33 |
| 6,418,017 B1 | 7/2002 | Patel et al. | |
| 6,430,038 B1 | 8/2002 | Helot et al. | |
| 6,437,973 B1 | 8/2002 | Helot et al. | |
| 6,464,195 B1 | 10/2002 | Hildebrandt | |
| 6,473,296 B2 | 10/2002 | Amemiya et al. | |
| 6,477,871 B1 | 11/2002 | Shaw et al. | |
| 6,483,445 B1 | 11/2002 | England | |
| 6,519,143 B1 | 2/2003 | Goko | |
| 6,519,147 B2 | 2/2003 | Nakagawa et al. | |
| 6,519,148 B2 | 2/2003 | Nakagawa et al. | |
| 6,532,152 B1 | 3/2003 | White et al. | |
| 6,594,149 B2 | 7/2003 | Yamada et al. | |
| 6,625,022 B2 | 9/2003 | Frutschy et al. | |
| 6,625,024 B2 | 9/2003 | Mermet-Guyennet | |
| 6,652,223 B1 | 11/2003 | Horng et al. | |
| 6,654,234 B2 | 11/2003 | Landry et al. | |
| 6,668,911 B2 * | 12/2003 | Bingler | 165/80.4 |
| 6,717,798 B2 | 4/2004 | Bell et al. | |
| 6,728,102 B2 | 4/2004 | Ishikawa et al. | |
| 6,755,626 B2 | 6/2004 | Komatsu et al. | |
| 6,768,637 B1 | 7/2004 | Amemiya | |
| 6,774,870 B2 | 8/2004 | Mead, Jr. et al. | |
| 6,785,128 B1 | 8/2004 | Yun | |
| 6,804,115 B2 | 10/2004 | Lai | |
| 6,808,371 B2 * | 10/2004 | Niwatsukino et al. | 417/353 |
| 6,809,927 B2 | 10/2004 | Ohashi et al. | |
| 6,809,930 B2 | 10/2004 | Mueller et al. | |
| 6,829,139 B1 | 12/2004 | Duarte | |
| 6,839,234 B2 * | 1/2005 | Niwatsukino et al. | 361/695 |
| 6,856,506 B2 | 2/2005 | Doherty et al. | |
| 6,873,521 B2 | 3/2005 | Landry et al. | |
| 6,894,899 B2 * | 5/2005 | Wu et al. | 361/699 |
| 6,924,978 B2 | 8/2005 | DiStefano | |
| 6,927,978 B2 | 8/2005 | Arai et al. | |
| 7,016,195 B2 * | 3/2006 | Ito et al. | 361/699 |
| 7,054,158 B2 | 5/2006 | Kimmich | |
| 7,055,581 B1 * | 6/2006 | Roy | 165/104.33 |
| 7,079,394 B2 | 7/2006 | Mok | |
| 7,095,614 B2 | 8/2006 | Goldman | |
| 7,124,811 B2 * | 10/2006 | Crocker et al. | 165/104.33 |
| 2002/0018337 A1 | 2/2002 | Nakamura | |
| 2002/0053421 A1 | 5/2002 | Hisano et al. | |
| 2002/0141159 A1 | 10/2002 | Bloemen | |
| 2003/0039097 A1 | 2/2003 | Igarashi | |
| 2003/0142474 A1 | 7/2003 | Karidis et al. | |
| 2003/0214786 A1 * | 11/2003 | Niwatsukino et al. | 361/699 |
| 2004/0001310 A1 | 1/2004 | Chu et al. | |
| 2004/0027800 A1 * | 2/2004 | Tanimoto et al. | 361/687 |
| 2004/0042176 A1 * | 3/2004 | Niwatsukino et al. | 361/699 |
| 2004/0057197 A1 | 3/2004 | Hill et al. | |
| 2005/0007739 A1 | 1/2005 | Gata | |
| 2005/0052833 A1 | 3/2005 | Tanaka et al. | |
| 2005/0068732 A1 | 3/2005 | Tsuji | |
| 2005/0117298 A1 * | 6/2005 | Koga et al. | 361/699 |
| 2005/0164624 A1 | 7/2005 | Hisamatsu | |

FOREIGN PATENT DOCUMENTS

| | | |
|---|---|---|
| JP | 07-049725 | 2/1995 |
| JP | 07-142886 | 6/1995 |
| JP | 08/046097 | 2/1996 |
| JP | 10-004161 | 1/1998 |
| JP | 10-055227 | 2/1998 |
| JP | 10-261884 | 9/1998 |
| JP | 10/303582 | 11/1998 |
| JP | 11-039058 | 2/1999 |
| JP | 11-166500 | 6/1999 |
| JP | 2000-049478 | 2/2000 |
| JP | 2001-057490 | 2/2001 |
| JP | 2001-230356 | 8/2001 |
| JP | 2001-251079 | 9/2001 |
| JP | 2002-099356 | 4/2002 |
| JP | 02002151638 A * | 5/2002 |
| JP | 2002-344186 | 11/2002 |
| JP | 2002-353670 | 12/2002 |
| JP | 2003-044169 | 2/2003 |
| JP | 2003-068317 | 3/2003 |
| JP | 2003-101272 | 4/2003 |
| JP | 2003-172286 | 6/2003 |
| JP | 2003-216278 | 7/2003 |
| JP | 2003-233441 | 8/2003 |
| JP | 2003-343492 | 12/2003 |
| JP | 2004-047921 | 2/2004 |
| JP | 3452059 | 2/2004 |
| JP | 3431024 | 8/2004 |

* cited by examiner

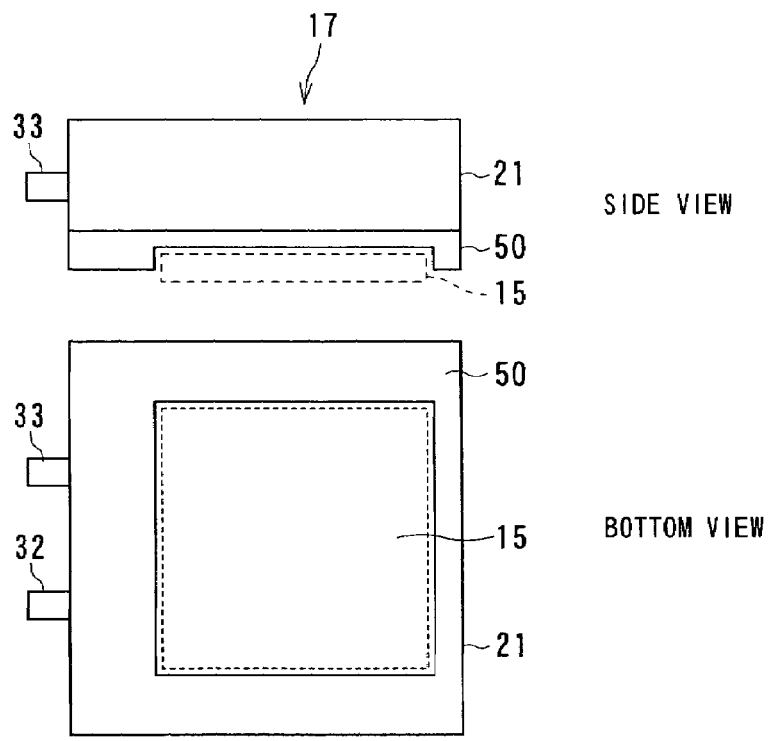
F I G. 9
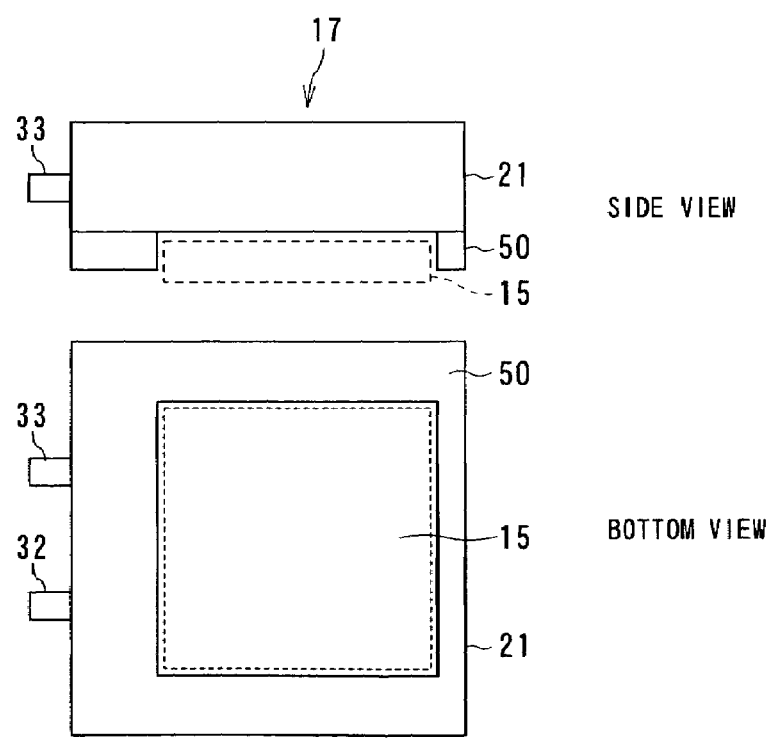
F I G. 10

PUMP, ELECTRONIC APPARATUS, AND COOLING SYSTEM

CROSS-REFERENCE TO RELATED APPLICATIONS

This application claims the benefit of priority of Japanese Patent Application No. 2004-134427, filed Apr. 28, 2004, the entire contents of which are incorporated herein by reference.

BACKGROUND

1. Field

The present invention relates to a pump used for a liquid-cooling type cooling system for cooling a heat generating unit.

2. Description of the Related Art

In recent years, improvement of information processing speed of an electronic apparatus such as a personal computer is remarkable, and the clock rate processed by a CPU (Central Processing Unit) or peripheral semiconductor devices for implementing such information processing is significantly increased in comparison with the related art.

In association with such a tendency, the heat release value of the CPU or other semiconductor devices increases correspondingly. Consequently, there exist semiconductor devices which cannot accommodate such an increased heat release value necessarily with a system in which a heat sink is thermally connected to the heat generating unit such as the CPU for cooling the heat sink with cooling air.

In order to cope with this problem, a technology to apply a liquid cooling type cooling system to a compact electronic apparatus such as a personal computer, which utilizes liquid as liquid coolant to obtain higher specific heat capacity than air and hence provides higher cooling efficiency, is developed.

For example, Patent Documents Jpn Pat. No. 3431024, Jpn Pat. No. 3452059, and Jpn Pat Publication No. 2003-172286 disclose a cooling system including a closed circular path for allowing liquid coolant to circulate, a heat discharger for discharging heat from the liquid coolant, and a pump for cooling the heat generating unit by pressurizing the liquid coolant for circulating the same in the closed circulating path and causing heat exchange between the liquid coolant and the heat generating unit by bringing the same into thermal contact with each other.

In the related art, the pump included a heat-receiving body for receiving heat by being brought into contact with the heat generating unit and a pump for circulating the liquid coolant which has received heat from the heat-receiving body, as separate independent components. In contrast to it, in the pump of this type, the pump is slimmed and downsized, and a pump case is used as a heat-receiving body, so that integrity of these components is realized.

In order to cool the heat generating unit such as a CPU with high level of cooling efficiency by circulating the liquid coolant, it is essential to strengthen thermal coupling between the heat generating unit such as the CPU and the heat-receiving body on the cooling system.

Therefore, the primary key point is to enhance heat conduction from the heat generating unit to the heat-receiving body. Therefore, the heat-receiving body is formed of a metallic material having high coefficient of heat conductivity, such as copper or aluminum.

For example, according to Jpn Pat. No. 3452059, copper or aluminum is used as a material for the pump case of the pump. Also, when aluminum is employed as the material for the pump case, copper having higher coefficient of heat conductivity than aluminum as an auxiliary heat conducting member is preferably provided between the heat generating unit and the pump case.

In this manner, it is extremely important to enhance the coefficient of heat conductivity of the pump case or the auxiliary heat conducting member joined thereto.

However, above described measure is not sufficient yet.

In general, the upper surface of the high-heat-generating semiconductor such as the CPU includes a square base board, and a metal square-plate-shaped member referred to as a heat spreader, which is slightly smaller than the base board. The heat spreader is intended to receive heat generated by the electronic device in the CPU, and to spread the same over the entire square surface of the spreader.

The portion of the high heat-generating semiconductor of the CPU which requires to be cooled (hereinafter referred to as "portion to be cooled") is the heat spreader, and the base board exposed around the heat spreader is not necessarily required to be cooled. Heat must be received efficiently only from the limited area, which corresponds to the heat spreader.

Therefore, the second key point for enhancing thermal coupling between the heat generating unit such as the CPU and the heat-receiving body on the cooling system is to position the heat-receiving body adequately at the portion to be cooled on the heat generating unit.

In the cooling pump which also serves as the heat-receiving body, the position of the cooling pump must adequately positioned with respect to the portion to be cooled on the heat generating unit.

Jpn Pat. No. 3452059 discloses a technology to form the contact surface of the pump case formed of highly heat conductive material with respect to the heat generating unit into a shape complementary to the three-dimensional shape of the heat generating unit. It also discloses a technology to form the contact surface of the auxiliary heat conducting member into a shape complementary to the three-dimensional shape of the heat generating unit when the auxiliary heat conducting member having a high coefficient of heat conductivity is provided.

These technologies are intended to enhance heat conduction with respect to the heat generating unit (the first key point described above), and are not intended for positioning of the heat generating unit and the pump.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 9 is an explanatory drawing illustrating a positioning member of the cooling pump according to the first embodiment of the invention;

FIG. 10 is an explanatory drawing illustrating the positioning member of the cooling pump according to a second embodiment of the invention.

DETAILED DESCRIPTION

Figure 1:
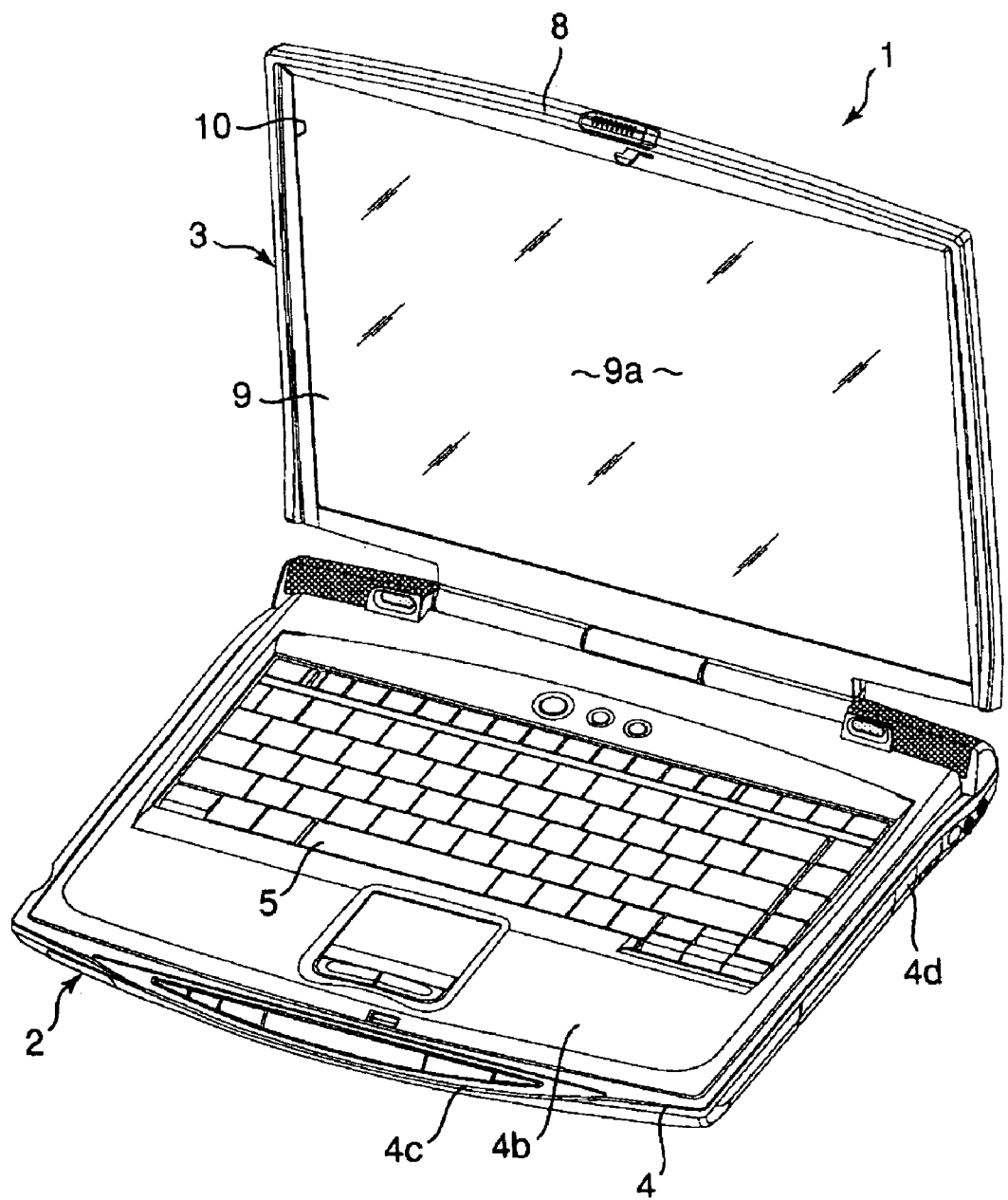
FIG. 1 is a first appearance view of an electronic apparatus according to a first embodiment of the invention.

Referring now to the drawings, embodiments of a cooling pump (pump), an electronic apparatus, and a cooling system according to the present invention will be described.

Figure 2:
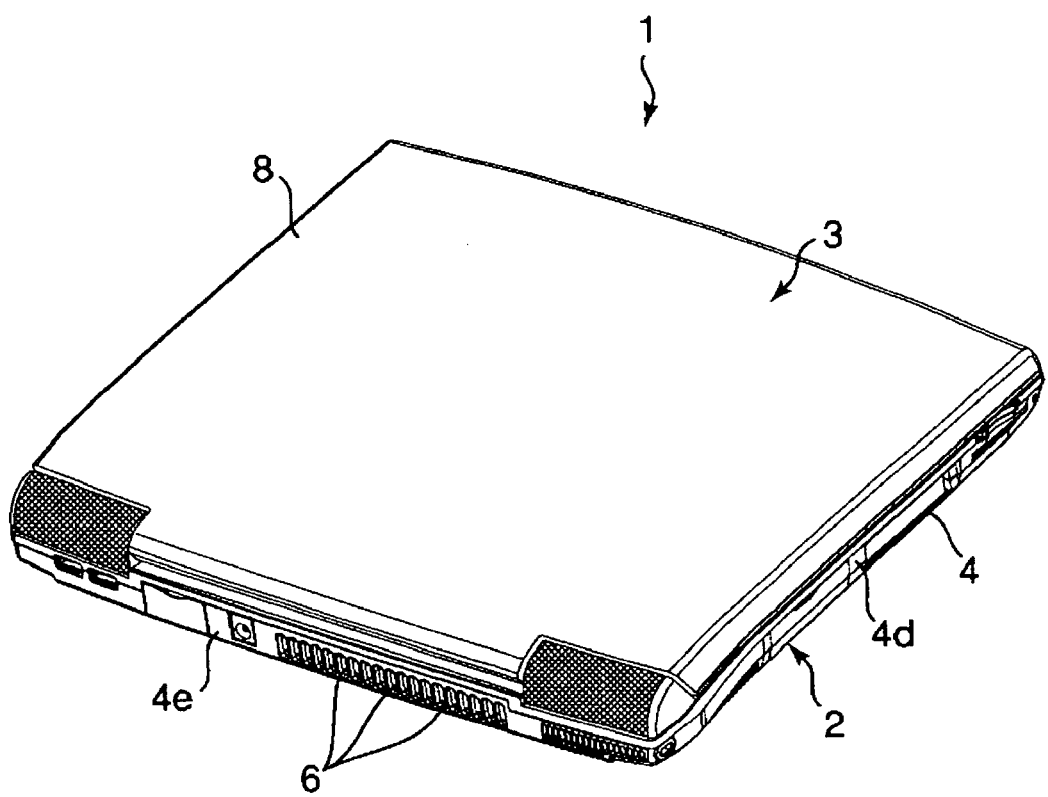
FIG. 2 is a second appearance view of the electronic apparatus according to the first embodiment of the invention.

FIGS. 1 and 2 are drawings showing an appearance of a personal computer 1 as an embodiment of the electronic apparatus according to the invention.

The personal computer 1 includes a computer body 2 and a panel unit 3.

The computer body 2 has a main body enclosure 4 of a thin box shape. The main body enclosure 4 includes a bottom wall 4a, an upper wall 4b, a front wall 4c, left and right side walls 4d and a rear wall 4e.

The rear wall 4e is provided with a plurality of exhaust ports 6 for discharging cooling air.

The upper wall 4b of the main body enclosure 4 supports a keyboard 5.

The panel unit 3 includes a panel unit enclosure 8 and a display device 9. The display device 9 is stored in the panel unit enclosure 8 and includes a display panel 9a. The display panel 9a is exposed from an opening 10 formed on the front surface of the panel unit enclosure 8.

The panel unit enclosure 8 is supported via hinges provided at the rear end of the main body enclosure 4 so as to be capable of opening and closing.

FIG. 1 shows an appearance in a state in which the panel unit 3 is opened, and FIG. 2 shows an appearance in a state in which the panel unit 3 is closed.

Figure 3:
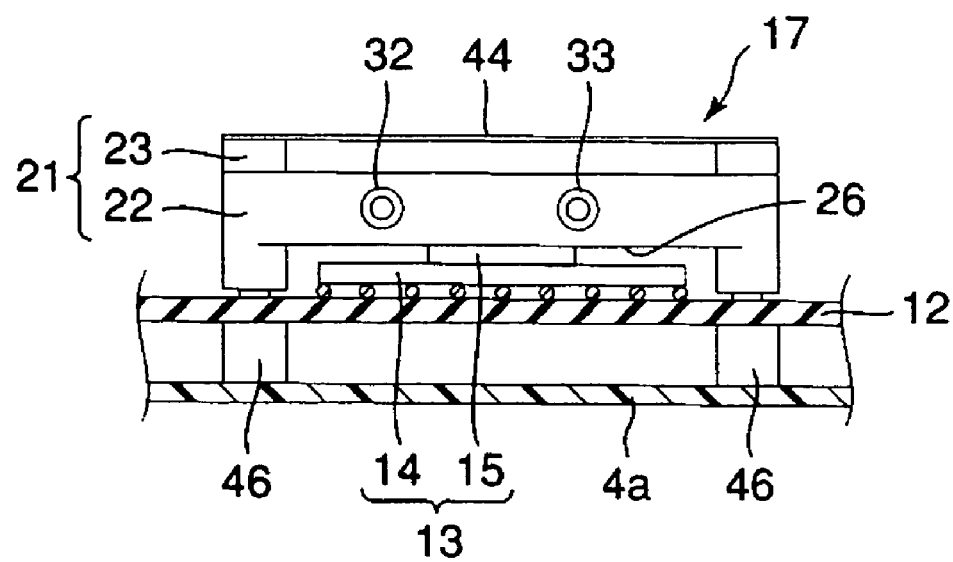
FIG. 3 is an explanatory drawing illustrating an embodiment of the mounting state of a cooling pump according to the invention.

FIG. 3 is a cross-sectional view of a printed board 12 stored in the main body enclosure 4, a semiconductor device such as a CPU 13 as a heat generating unit mounted on the printed board 12, and a cooling pump 17 thermally connected to the CPU 13.

The printed board 12 is disposed, for example, in parallel with the bottom wall 4a of the main body enclosure 4. The CPU 13 is mounted to one surface, for example to the upper surface of the printed board 12.

The CPU 13 includes a base board 14 and a heat spreader 15 provided at the center on the upper surface of the base board 14. To cool the heat spreader 15 efficiently is essential for maintaining the operation of the CPU 13.

The outer surface of a bottom wall 25 of a cooling pump 17 corresponds to a heat-receiving surface 26, and is thermally connected to the surface of the heat spreader 15.

Figure 4:
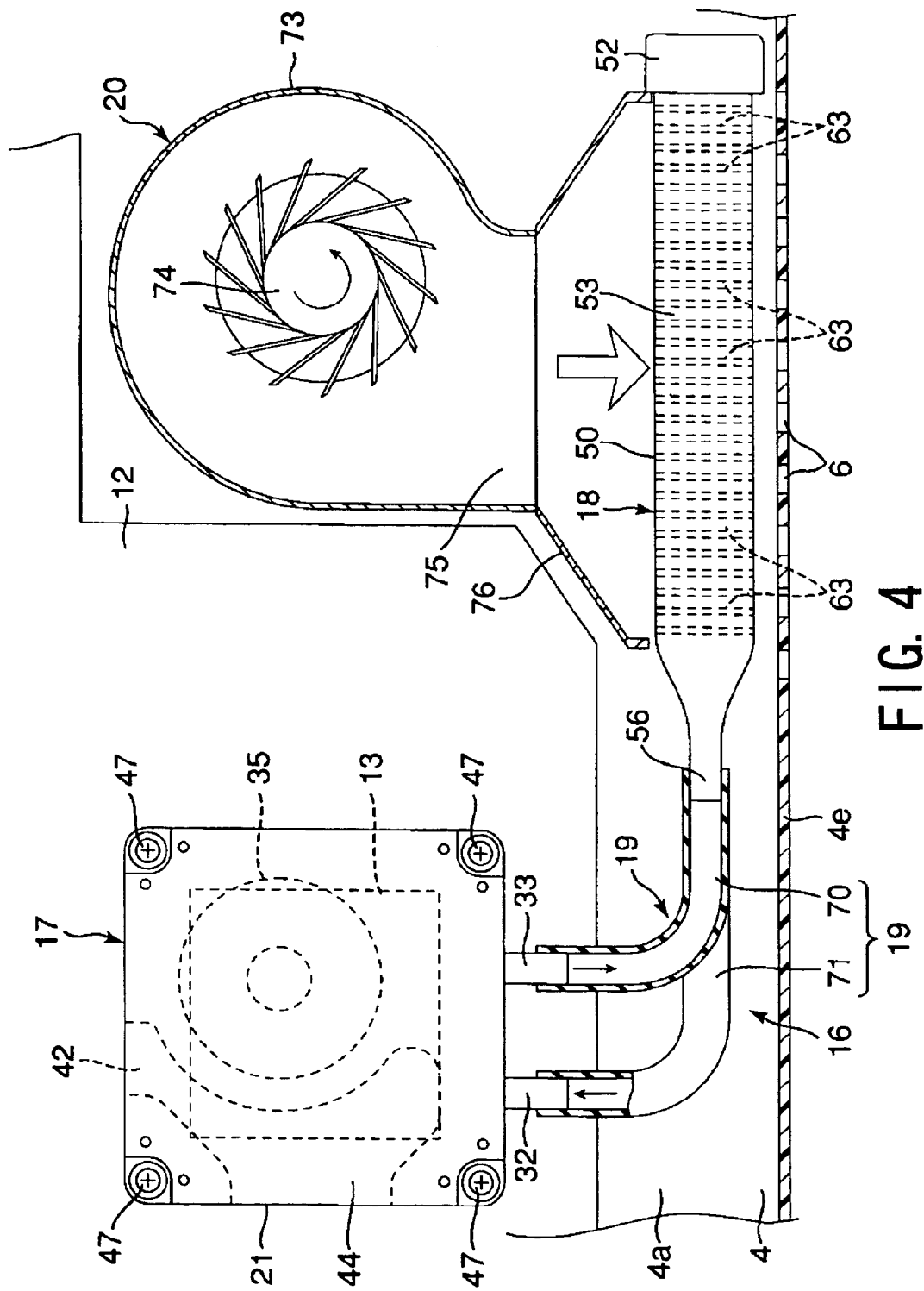
FIG. 4 is a drawing showing a structure of an embodiment of a cooling system provided on the electronic apparatus according to the invention.

FIG. 4 shows an example of a structure of a cooling system 16 stored in the computer body 2.

The cooling system 16 includes the cooling pump 17, a heat discharging portion 18, a circulating path 19, and an electric fan 20.

The cooling pump 17 is disposed so as to cover the CPU 13 mounted to the printed board 12. Screws 47 penetrate the four corners of the cooling pump 17. The screws 47 further penetrate the printed board 12, and are screwed into four bosses 46 fixed to the bottom wall 4a of the main body enclosure 4.

With this screwing, the cooling pump 17 is fixed to the printed board 12 and the bottom wall 4a of the main body enclosure 4, and is thermally connected to the CPU 13.

The cooling pump 17 integrally formed with an intake pipe 32 for sucking liquid coolant and a discharge pipe 33 for discharging the liquid coolant.

The heat discharging portion 18 includes a first path 50, a second path 51, and a third path 52 through which the liquid coolant flows.

Figure 5:
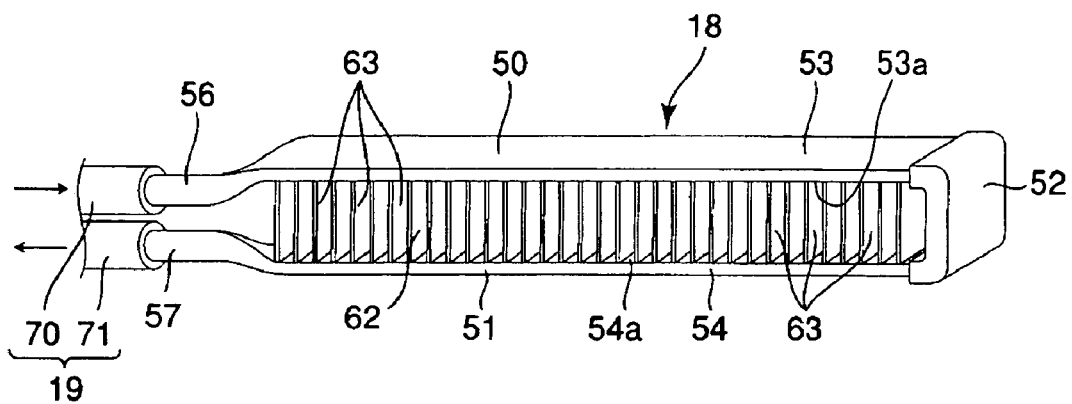
FIG. 5 is a drawing showing a structure of a heat-generating portion of the cooling system.

FIG. 5 is a perspective view showing a detailed structure of the heat discharging portion 18. As shown in FIG. 5, the first and second path 50, 51 are provided with pipes 53, 54 with flat cross-section, respectively. The pipes 53, 54 are disposed so that the longitudinal axes of the respective cross sections are oriented in parallel with the bottom wall 4a of the main body enclosure 4.

At the upstream end of the first path 50, the cross-sectional shape of the pipe 53 is changed into a circle, which serves as a liquid coolant entrance 56 for allowing the liquid coolant to flow in. On the other hand, the downstream end of the first path 50 remains its flat cross-sectional shape and is connected to the upstream end of the third path 52.

At the downstream end of the second path 51, the cross-sectional shape of the pipe 54 is changed into a circle, which serves as a liquid coolant exit 57 to allow the liquid coolant to flow out. On the other hand, the upstream end of the second path 51 remains its flat cross-sectional shape and is connected to the downstream end of the third path 52.

A plurality of cooling fins 63 are disposed between a supporting surface 53a of the pipe 53 and a supporting surface 54a of the pipe 54. The cooling fin 63 is fixed to the supporting surfaces 53a, 54a by, for example, soldering, so that the cooing fin 63 and the pipes 53, 54 are thermally connected.

Spaces between the cooling fins 63 form a plurality of cooling air passages 62.

The circulating path 19 is provided with an upstream pipe portion 70 and a downstream pipe portion 71, as shown in FIG. 4.

One end of the upstream pipe portion 70 is connected to the discharge pipe 33 of the cooling pump 17 and another end of the upstream pipe portion 70 is connected to the liquid coolant entrance 56 of the first path 50.

On the other hand, one end of the downstream pipe portion 71 is connected to the intake pipe 32 of the cooling pump 17 and another end of the downstream pipe portion 71 is connected to the liquid coolant exit 57 of the second path 51.

The electric fan 20 distributes cooling air to the heat discharging portion 18.

The electric fan 20 includes a fan casing 73, and a fan impeller 74 to be stored in the fan casing 73.

The fan casing 73 includes a cooling air discharge port 75 for discharging cooling air, and an air conducting duct 76 for guiding discharged cooling air to a heat-discharging portion.

The structure of the cooling pump 17 will now be described in detail.

Figure 6:
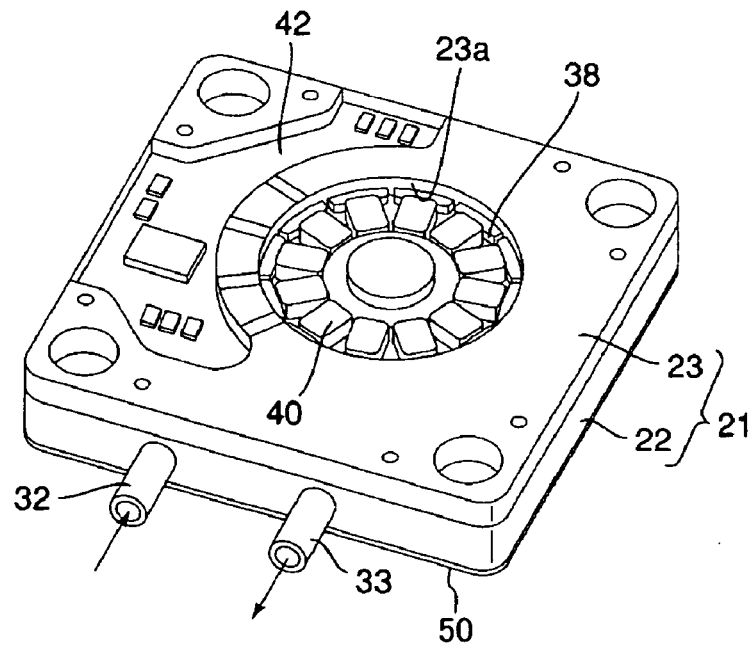
FIG. 6 is a first drawing showing a structure of the cooling pump according to the first embodiment of the invention.
Figure 7:
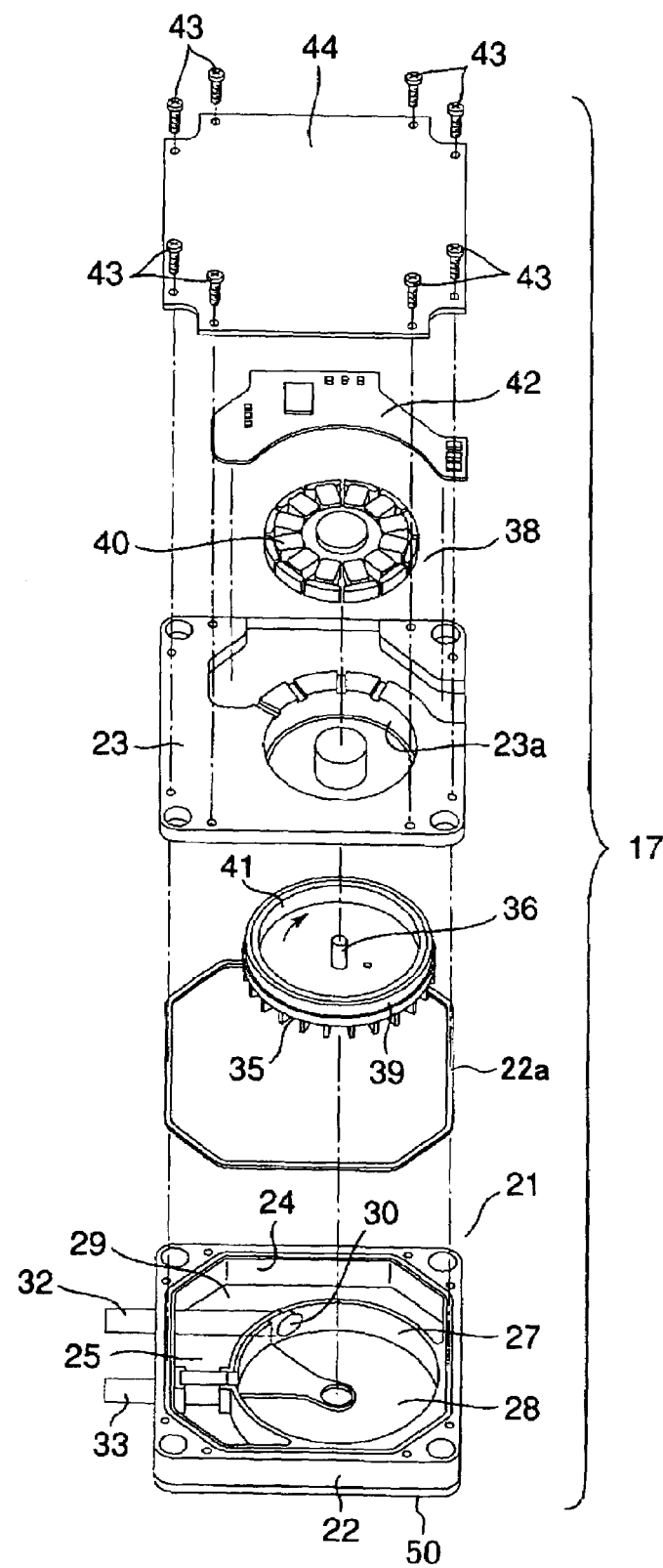
FIG. 7 is a second drawing showing the structure of the cooling pump according to the first embodiment of the invention.

FIG. 6 and FIG. 7 are explanatory drawings illustrating a structure of the cooling pump 17 according to the first embodiment of the invention.

The cooling pump 17 includes a pump housing 21 which serves as a heat receiving portion. The pump housing 21 includes a case 22 and a cover 23.

The case 22 is formed of metallic material having high coefficient of heat conductivity such as copper or aluminum. The cover 23 is formed of resin material. The case 22 and the cover 23 are joined via an O-ring 22a. The case 22 has a recess 24 opened upward in FIG. 7, and the bottom wall 25 of the recess 24 opposes to the CPU 13. The lower surface of the bottom wall 25 corresponds to the heat-receiving surface 26 to be thermally connected to the CPU 13.

A positioning member 50 is joined to the bottom wall 25. The positioning member 50 is provided for aligning the cooling pump 17 with the portion to be cooled of the CPU 13.

The recess 24 is partitioned by a partitioning wall 27, which defines a pump chamber 28 and a reserve chamber 29. The reserve chamber 29 is for storing liquid coolant.

The partitioning wall 27 includes an inlet port 30 and a discharge port 31. The intake pipe 32 is connected to the inlet port 30 for sucking the liquid coolant into the pump chamber 28. The discharge pipe 33 is connected to the discharge port 31 for discharging liquid coolant from the pump chamber 28.

A rotor 39 is stored in the pump chamber 28.

The rotor 39 is formed into a disk shape, and a revolving shaft 36 is fixed at the center thereof. The revolving shaft 36 is rotatably supported at one end by the center of the pump chamber 28 and at the other end by the center of the cover 23.

The rotor 39 includes impellers 35 for pressurizing the liquid coolant. A plurality of permanent magnets are embedded in an annular side wall 41 of the rotor 39. The impellers 35 and the plurality of permanent magnets integrally rotate about the revolving shaft 36.

The cover 23 covers the pump chamber 28 in which the rotor 39 is stored and the reserve chamber 29 in a liquid-tight manner.

A stator 38 is stored in a recess 23a formed on the upper surface of the cover 23 in FIG. 7. The stator 38 includes a plurality of electromagnets 40.

By applying predetermined current to the electromagnets 40, the stator 38 generates revolving magnetic field. The stator 38 causes the rotor 39 to generate torque and hence to rotate by a repulsive force between the revolving magnetic field and the magnetic field of the permanent magnets provided on the rotor 39, and circulates the liquid coolant by pressurizing the impeller 35 provided on the rotor 39.

A control circuit board 42 for controlling current to be applied to the electromagnets 40 is stored in the cover 23.

A lid 44 is for covering and protecting the stator 38 and the control circuit board 42, and is fixed to the pump housing 21 via screws 43.

Figure 8:
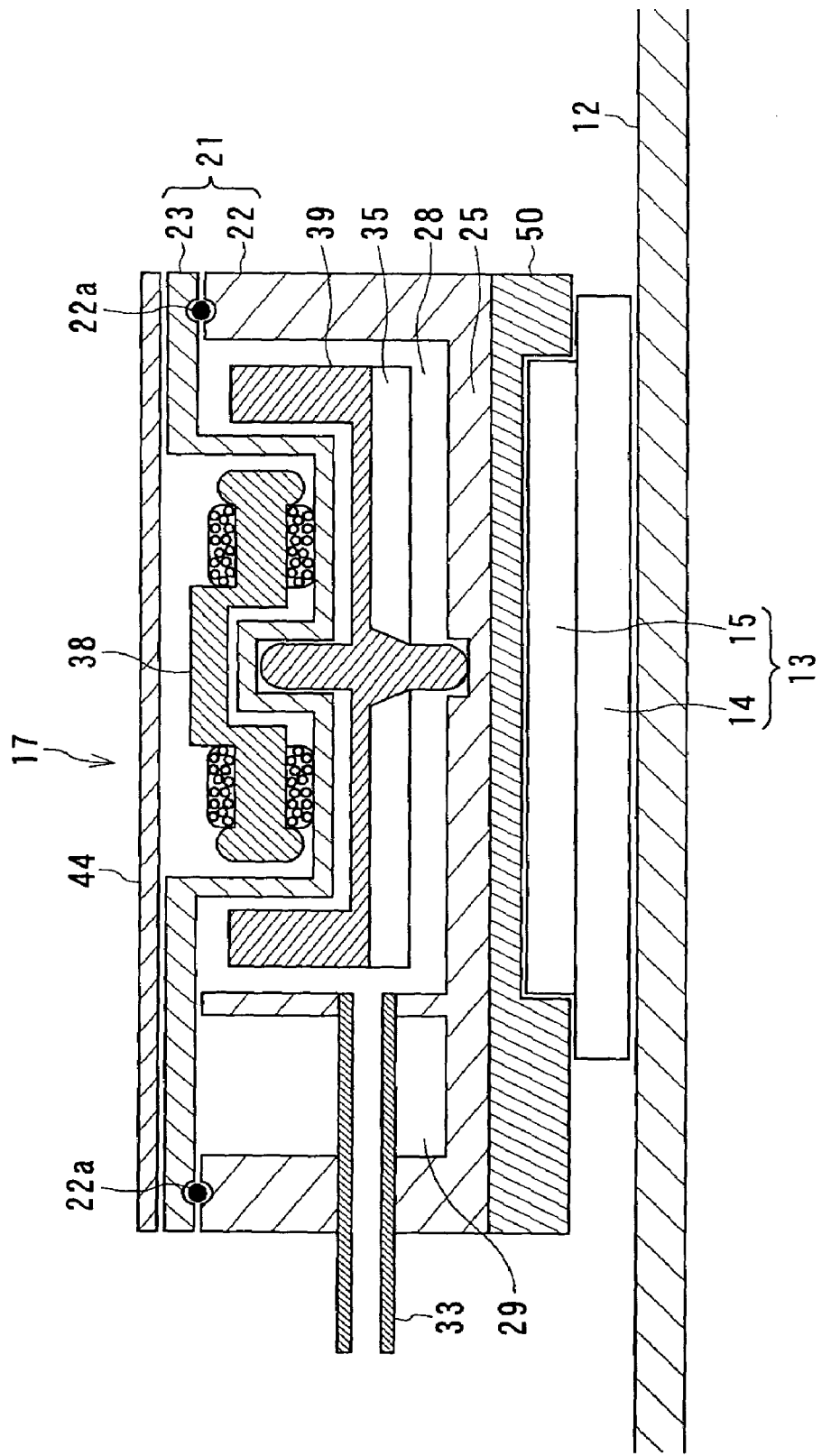
FIG. 8 is a cross-sectional view illustrating the structure of the cooling pump according to the first embodiment of the invention.

FIG. 8 is a drawing showing the cross-section of the cooling pump 17 schematically.

The positioning member 50 is joined to the case 22 of the cooling pump 17. The positioning member 50 is formed so as to be capable of being fitted to the CPU 13 mounted on the printed board 12.

The CPU 13 includes the base board 14 and the heat spreader 15. The heat spreader 15 corresponds to the portion to be cooled of the CPU 13.

The pump housing 21 of the cooling pump 17 is provided with the pump chamber 28 and the reserve chamber 29. The portion where the flow rate of the liquid coolant is high and hence high cooling capability is provided is, for example, the portion of the bottom wall 25 on the pump chamber 28 side, while the cooling capability is not sufficient at the portion on the reserve chamber 29 side in comparison with the pump chamber 28 side. As will be understood, the cooling capability is not evenly spread over the bottom wall 25 of the pump housing 21.

Therefore, by bringing the portion of the bottom wall 25 having the highest cooling capability and the portion to be cooled on the CPU 13 in line, thermal coupling is enhanced as a whole and the cooling capability is improved.

The positioning member 50 is provided for achieving this purpose. In other words, the positioning member 50 can establish the relative position between the cooling pump 17 and the CPU 13 in such a manner that the portion of the bottom wall 25 having the highest cooling capability is brought into line with the portion to be cooled on the CPU 13 in line.

Also, with the provision of the positioning member 50, positioning operation in the assembly process of the electronic apparatus 1 can be extremely facilitated.

In conjunction with this, by ensuring uniform positioning between the cooling pump 17 and the CPU 13, fluctuations in cooling capability between the projects of the electronic apparatus 1 can be eliminated, and hence uniform cooling capability is ensured.

As shown in FIG. 9, the positioning member 50 has a plate shape having a recess in which the heat spreader 15 of the CPU 13, for example, can be fitted. In order to transfer heat generated by the heat spreader 15 to the pump housing 21 efficiently, at least the recessed portion is required to be formed of metallic material with high coefficient of heat conductivity.

The similar positioning effect can be obtained by forming the bottom wall 25 of the pump housing 21 into a recessed shape. However, the size and shape of the portion to be cooled on the CPU 13 differ depending on the type of the electronic apparatus 1. Therefore, when the recess is provided on the bottom wall 25 of the pump housing 21, the pump housings 21 having different shapes for the respective types of CPU 13 are required.

On the other hand, when the positioning member 50 and the pump housing 21 are configured as separate structures, change in shape of the CPU 13 can be accommodated only by change in shape of the positioning member 50.

FIG. 10 shows a second embodiment of the cooling pump 17. The positioning member 50 is different from the cooling pump 17 according to the first embodiment.

The positioning member 50 in the second embodiment has a plate shape having a hollow at the center. It is intended to enable positioning between the cooling pump 17 and the CPU 13 by forming the shape of the hollow so as to be capable of fitting to the heat spreader 15 which is the portion to be cooled.

Since the center of the positioning member 50 is formed with the hollow in the second embodiment, the heat spreader 15 and the bottom wall 25 of the pump housing 21 are thermally connected directly.

Therefore, a high coefficient of heat conductivity is not required for the material of the positioning member 50, and hence the material may not be metal. For example, synthetic resin is applicable.

Since the second embodiment achieves the same effect as the first embodiment and, in addition, the material for the positioning member 50 can be selected from the broader options than that in the first embodiment, reduction of weight or the processing cost can be reduced.

Figure 11:
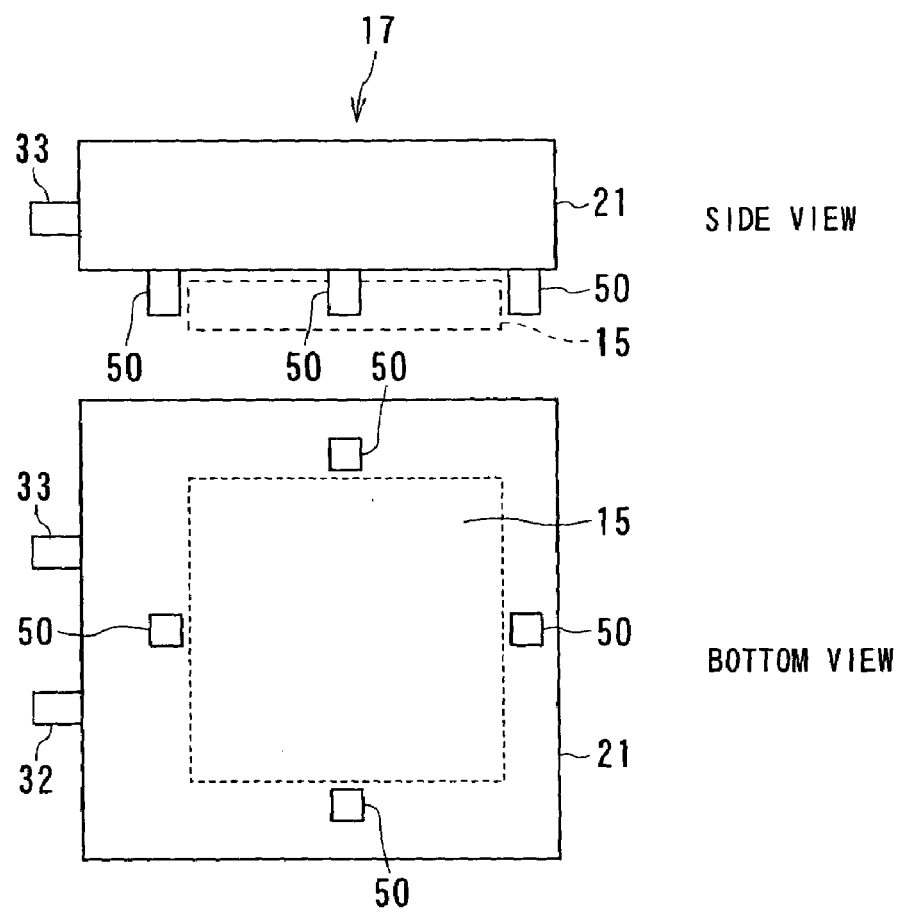
FIG. 11 is an explanatory drawing illustrating the positioning member of the cooling pump according to a third embodiment of the invention.

FIG. 11 shows the cooling pump 17 according to a third embodiment.

In the third embodiment, the positioning member 50 is configured from a plurality of guide pins. In the example shown in FIG. 11, they are configured of four short square columns.

The number and the shape of the guide pins are not limited to the example shown in FIG. 11. The number and the shape of the guide pins can be selected within the idea of positioning the heat spreader 15.

The material of the guide pins is also not limited to the metallic material as in the case of the second embodiment.

According to the third embodiment, the same effect as the first and second embodiments can be obtained, and further reduction of weight is possible.

Subsequently, referring to FIG. 4 and FIG. 8, the operation of the cooling pump 17 and the cooling system 16 having the cooling pump 17 according to the present invention will be described.

The heat spreader 15 of the CPU 13 as the a heat generating unit is thermally connected to the surface of the recess on the positioning member 50 shown in FIG. 8 via heat conductive grease or a heat conductive sheet (not shown).

In the second and third embodiments of the cooling pump 17, the heat spreader 15 is thermally connected to the bottom wall 25 of the pump housing 21 via the heat conductive grease or the heat conductive sheet (not shown).

Heat generated at the CPU 13 is transferred to the inner surface of the pump chamber 28 via the positioning member 50 or directly from the outer surface of the bottom wall 25.

Cooled liquid coolant is flown into the pump chamber 28 from the intake pipe 32 through the inlet port 30. Heat of the CPU 13 transferred to the inner surface of the pump chamber 28 is transferred to the cooled liquid coolant. Consequently, the liquid coolant receives the heat.

On the other hand, the rotor 39 receives torque by the revolving magnetic field generated by the stator 38 and is rotating. The liquid coolant, having received the heat is pressurized by the rotation of the impellers 35 provided on the rotor 39 and discharged through the discharge port 31 from the discharge pipe 33.

As shown in FIG. 4, the liquid coolant, having received the heat, is pressurized by the cooling pump 17, discharged from the discharge pipe 33, and is flown into the heat-discharging portion 18 through the upstream pipe portion 70 of the circulating path 19.

In the heat discharging portion 18, the liquid coolant circulates through the first path 50, the third path 52, and the second path 51. During this circulation, the heat of the liquid coolant having received the heat is transferred to the first path 50, the second path 51, and the heat-discharging fins 62 thermally connected to the first path 50 and the second path 51.

On the other hand, cooling air generated by the rotation of the impellers 74 for a fan of the electric fan 20 hits against the first and second paths 50, 51, and the heat-discharging fins 62 to remove heat therefrom, and then is discharged from the plurality of exhaust ports 6 provided on the rear wall 4e of the main body enclosure 4.

The liquid coolant having received the heat is cooled while it is circulating through the heat discharging portion 18 as described above. The liquid coolant thus cooled passes through the downstream pipe portion 71 of the circulating path 19 and returns from the intake pipe 32 of the cooling pump 17 to the pump chamber 28.

By repeating this cycle, the heat generated at the CPU 13 is discharged outside the main body enclosure 4 by cooling air generated at the electric fan 20 in sequence.

The invention is not limited to the above-described embodiments as is, and may be embodied by modifying the components without departing from the gist of the invention in the state of implementation. It is also possible to form various modes by combining the plurality of components disclosed in the embodiments adequately. For example, some components may be eliminated from all the components shown in the embodiments.

What is claimed is:

1. A pump comprising:
   a pump housing including
   a pump chamber, and
   a heat receiving portion to couple to a heat generating unit, the heat receiving portion has a recess corresponding to the heat generating unit;
   an impeller provided in the pump chamber, and
   a motor coupled to the impeller, the motor to rotate the impeller to pump a liquid coolant.

2. A pump according to claim 1,
   wherein the heat receiving portion comprise a positioning member and,
   the positioning member has the recess corresponding to the heat generating unit.

3. A pump according to claim 1,
   wherein the heat receiving portion comprise a positioning member and,
   the positioning member is formed with a hollow corresponding to the heat generating unit.

4. A pump according to claim 1,
   wherein the beat receiving portion comprises a positioning member and,
   the positioning member comprises a plurality of guide pins.

* * * * *